United States Patent

[11] 3,593,733

[72] Inventors Gary L. Roffman;
Richard Deadwyler, both of Washington, D.C.
[21] Appl. No. 828,188
[22] Filed May 27, 1969
[45] Patented July 20, 1971
[73] Assignee The United States of America as represented by the Secretary of the Navy

[54] INTERNAL FEEDBACK PROPORTIONAL FLUERIC AMPLIFIER
5 Claims, 1 Drawing Fig.

[52] U.S. Cl. ........ 137/81.5
[51] Int. Cl. ........ F15c 1/14
[50] Field of Search ........ 137/87.5

[56] References Cited

UNITED STATES PATENTS

| | | | |
|---|---|---|---|
| 3,486,520 | 12/1969 | Hyer et al. | 137/81.5 |
| 3,275,013 | 9/1966 | Colston | 137/81.5 |
| 3,294,103 | 12/1966 | Bowles | 137/81.5 |
| 3,452,772 | 7/1969 | Zaloudek | 137/81.5 |
| 3,474,805 | 10/1969 | Swartz | 137/81.5 X |

*Primary Examiner*—William R. Cline
*Attorneys*—Harry M. Saragovitz, Edward J. Kelly, Herbert Berl and J. D. Edgerton

ABSTRACT: An internal feedback proportional flueric amplifier which includes a power jet input channel, a left control input channel, a right control input channel, a first output channel and a second output channel. Blunt splitters are provided such that flow from the power jet input channel when entering the interaction region within the amplifier will create internal feedback vortices therein. The effect of the vortices so created is to cause low-pressure areas along the sides of the power jet flow so that when a control signal is applied to one of the control input channels a high-pressure gain, stable, minimum noise amplifier will be obtained.

PATENTED JUL 20 1971 3,593,733
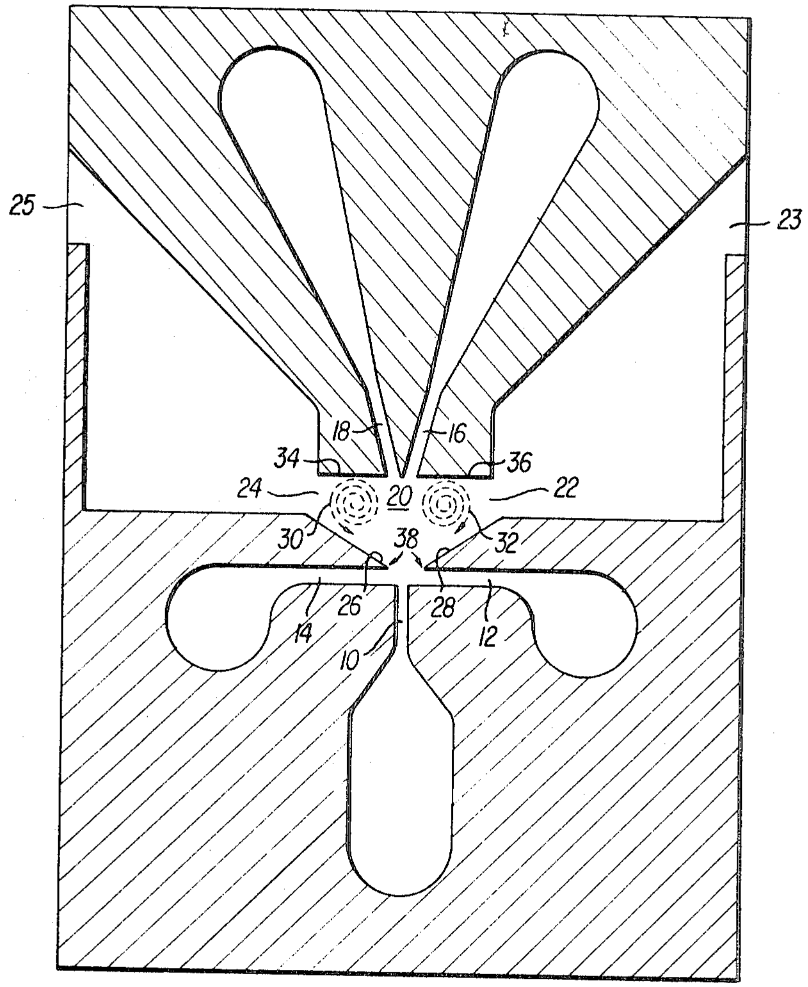
INVENTORS
GARY L. ROFFMAN
RICHARD DEADWYLER
BY Harry M. Saragovitz, Edward J. Kelly, Herbert Berl, + J. D. Edgerton
ATTORNEYS

INTERNAL FEEDBACK PROPORTIONAL FLUERIC AMPLIFIER

BACKGROUND OF THE INVENTION

This invention relates generally to flueric amplifiers and more particularly to a proportional flueric amplifier which is capable of producing high-pressure gain because of internal feedback developed therein.

In the past, it has been found that the pressure gain of a proportional flueric amplifier could be increased by the use of external positive feedback. This external positive feedback would be provided by feeding the respective amplifier outputs back to the control inputs on the opposite sides thereof. While the above technique of increasing amplifier gain was found to be somewhat satisfactory, it became apparent that the time delays inherent in an external-feedback-type arrangement would not only decrease the stability of the flueric amplifier, but would increase the noise thereof. Moreover, it was found that a nonlinear gain characteristic curve for a given amplifier input would occur in external-positive-feedback-type arrangement.

One other problem with prior art flueric amplifiers was that when loaded, such for example as by the cascading of several similar amplifier stages, it was found that the effective gain of each stage would decrease thus giving an overall lower cascaded gain.

Additionally, in the past while flueric amplifiers with external positive feedback could be used as an integrating device, this required the placing of external high-impedance flow resistors in the feedback channels thereof so that the time response of the system would become quite long and accordingly, approach an integration time.

SUMMARY OF THE INVENTION

Accordingly, one object of the present invention is the provision of a new and improved proportional flueric amplifier.

Another object of the instant invention is to provide a new and improved proportional flueric amplifier with a higher signal-stage pressure gain than has heretofore existed.

A further object of this invention is the provision of a unique high-gain proportional flueric amplifier having internal feedback inherent therein.

Still another object of the subject invention is to provide a high-gain internal feedback proportional flueric amplifier which is both stable and quiet.

Yet another object of this invention is to provide a new and improved internal feedback proportional flueric amplifier which has minimum feedback delays, such that a linear high-gain characteristic curve for a given input signal is provided.

Still another object of this invention is the provision of a new improved internal feedback proportional flueric amplifier the gain of which, in fact, increases when subjected to a loaded condition.

One other object of the instant invention is to provide a new and improved internal feedback proportional flueric amplifier which may be used as an integrating device when the gain is adjusted to a large value without any need for the use of external flow resistors.

Briefly, in accordance with this invention the foregoing and other objects are attained in one aspect by the use of a proportional flueric amplifier which includes blunt splitters on the sides of the amplifier output channels such that when power jet flow enters the amplifier interaction region the blunt splitters will produce an internal positive feedback vortex, the effect of which is to increase the pressure gain of the amplifier.

BRIEF DESCRIPTION OF THE DRAWING

A more complete appreciation of the invention and many of the attendant advantages thereof will be readily apparent as the same becomes better understood by reference to the following detailed description when considered in connection with the accompanying solitary view which illustrates an internal feedback proportional flueric amplifier according to the present invention.

DETAILED DESCRIPTION OF THE PREFERRED EMBODIMENT

Referring now to the drawing, the proportional flueric amplifier of the present invention is shown as consisting of a conventional power jet input channel 10, right control input channel 12, a left control input channel 14, a right output channel 16 and a left output channel 18. Fluid flow may be provided to the power jet input channel 10 from any desired source, such for example as water, air, gas or the like and will enter the interaction region 20. This fluid flow will then divide with one portion thereof exiting through a right bleed channel 22 into a right vent channel 42 and a right vent 23 and another portion exiting through a left bleed channel 24 into a left vent chamber 44 and a left vent 25, with other portions thereof exiting through right output channel 16 and left output channel 18. Vent chambers 42 and 44 are bounded by sidewalls 43 and 45 respectively to guide fluid to vents 23 and 25 respectively. The source of flow from the power jet channel 10 will also produce low-pressure regions along the left side 26 and the right side 28 of the jet flow. These low-pressure regions are caused by internal positive feedback vortices 30 and 32 which are respectively produced by the jet flow upon collision thereof with a left blunt splitter 34 and a right blunt splitter 36. Now assuming that a control signal is applied to the left control input channel 14, an increased proportion of the jet flow within the interaction region 20 will be directed through the right bleed channel 22, the right vent 23 and the right output channel 16. The effect of this increased jet flow on the right side of the interaction region 20 will be to still further reduce the pressure along the right side 28 because of the resulting increase in the velocity of vortex 32, which is in turn caused by a greater flow striking the right blunt splitter 36. A pressure differential will now exist across the jet flow area due to the difference in pressure existing along sides 26 and 28 thereof. The effect of this pressure differential will be to further enchance the proportion of jet flow (in the same direction as the control signal) that will enter the right bleed channel 22, the right vent 23 and the right output channel 16. Thus, it should be apparent that a much larger deflection of the jet flow to the right side of the interaction region 20 will be produced than would be produced by the control signal itself. This larger deflection will in turn produce a much greater pressure differential across the output channels 16 and 18 of the flueric amplifier for the same control input pressure differential and thereby result in a high-pressure gain amplifier without the need of external positive feedback. It should be understood that a similar high-pressure gain amplifier will result if a control signal is applied to the right control input channel 12, instead of the left control input channel 14 as described above, the delays inherent in an external-type feedback arrangement are eliminated and the amplifier stability thereby increased.

In addition, the noise output of the flueric amplifier of the present invention both as an audible acoustic signal and as fluctuations in the output signal is quite low. This is because the blunt splitters 34 and 36 reduce edge tone oscillations which are normally present in conventional flueric amplifiers and thereby give a resulting lower noise output.

It has also been found that when the internal feedback amplifier of the present invention is utilized for extremely high gain that the time response of the system will be quite long and approximate an integration, thus allowing the amplifier to operate as an integrating device without the requirement of high-impedance external flow resistors as previously required.

One other feature of the present invention is that with the internal feedback arrangement it has been found that the pressure gain of the amplifier actually increases when subjected to a loaded condition. Thus, when the amplifier output channels 16 and 18 are used to drive a similar stage in a cascade arrangement or are partially blocked by the use of flow resistors or the like, the amplifier gain will in fact increase as opposed to prior amplifiers which would in fact lose as much as half the gain which exists in an unloaded condition.

Also, it has been found that because of internal feedback the amplifier of the present invention will provide a linear characteristic gain curve for a given input signal.

Referring now again to the solitary FIGURE, it should be understood that the geometry of the amplifier of the subject invention is important and can effect the gain thereof by determining the velocities of vortices 30 and 32 and thus the low pressure developed along the sides 26 and 28 of the jet flow. For example, the setback distance, designated by the arrows 38, of the input channels 12 and 14 must be small, of the order of three times the nozzle width of the power channel 10. Increasing the setback width will reduce the amplifier gain, while decreasing the same will increase the gain. Additionally, decreasing the size of the right bleed flow region 22 and the left bleed flow region 24 will tend to reduce the gain. In fact, any geometric change that will change the amount of flow that will enter the low-pressure areas along the sides 26 and 28 of the jet flow can influence the gain of the amplifier. Thus, if the vent areas 23 and 25 are reduced, the gain of the amplifier will likewise be reduced. This occurs since the spilled bleed flow will now be caused to produce a back pressure which in turn will move the power jet in a direction counter to the control flow.

The geometry of the amplifier of the subject invention can also affect the amount of noise present therein. For example, the width of the bleed channels 22 and 24 should be set so that the flow therethrough will fill the channel walls and attach thereto. Otherwise, low-frequency fluctuations in the flow will occur and produce pressure signals which could cause noise in the amplifier output. Such an adjustment of the width of the bleed channels 22 and 24 will also provide the proper amount of negative feedback to maintain amplifier stability and will also minimize the effect of disturbances from outside the amplifier. Likewise, blocking the vent channels 22 and 24 will have the advantageous effect of reducing oscillations and hence amplifier noise, but will also have the disadvantage of reducing the amplifier gain.

Because of the importance of the dimensions of the amplifier of the subject invention, typical values thereof for an exemplary preferred embodiment are as follows:

Width of Power Jet 10=0.0015″
Width of Bleed Channels 22 and 24=0.0053″
Width of Output Channels 16 and 18=0.0015″
Width of Control Channels 12 and 14=0.0023″
Length of Blunt Splitters 34 and 36=0.010″
Width of Vent Channels 23 and 25=.0015″
Control Setback width =0.0045″
Depth of Amplifier =0.0010—0.0050″

It should be understood, however that the above dimensions are given by way of example only and not by way of limitation. Thus, other high-pressure gain amplifiers of any desired size may be readily designed in accordance with the described invention.

Obviously, numerous other modifications and variations of the present invention are possible in the light of the above teachings. For example the blunt splitters of the present invention could be either angled or of curved shape. Such a modification will have the disadvantage of slightly reducing the amplifier gain, but will have the advantage of further reducing amplifier noise and increasing the stability thereof. It is therefore to be understood that within the scope of the appended claims, the invention may be practiced otherwise than as specifically described herein.

What we claim as new and desire to be secured by Letters Patent of the United States is:

1. A proportional fluid amplifier comprising:
a. a power jet input channel for issuing power fluid into an interaction region;
b. an interaction region for receiving said power fluid;
c. control channels for deflecting said power fluid;
d. output channels for receiving that portion of said power fluid which is deflected by said control channels;
e. first and second vent chambers in communication with said interaction region, each of said vent chambers being bounded by sidewalls for directing a portion of said power fluid to atmosphere; and
f. first and second blunt splitters contiguous with said sidewalls and facing said interaction region for deflecting that portion of said power fluid impinging thereon back toward said interaction region so as to create internal positive feedback vortices, said blunt splitters being located between said output channels and said vent chambers.

2. A proportional flueric amplifier as in claim 1 wherein said internal positive feedback caused is due to a first vortex and a second vortex being created upon said source of flow striking said first and said second blunt splitters, the effect being to create a pressure differential across said source of flow such that upon the application of said control signal a greater amount of flow will enter said output channel on the opposite side of said control channel then would occur by said control alone whereby said high-pressure gain is obtained.

3. A proportional flueric amplifier as in claim 2 wherein said blunt splitters are curved whereby both the pressure gain and noise of said amplifier are reduced.

4. A proportional flueric amplifier as in claim 2 wherein said blunt splitters are angled such that both the pressure gain and noise of said amplifier are reduced.

5. A proportional flueric amplifier as in claim 2 wherein said control input channels are of the order of three times the nozzle width of said power jet channel.

PO-1050
(5/69)

UNITED STATES PATENT OFFICE
CERTIFICATE OF CORRECTION

Patent No. 3,593,733 Dated July 20, 1971

Inventor(s) Gary L. Roffman and Richard Deadwyler

It is certified that error appears in the above-identified patent and that said Letters Patent are hereby corrected as shown below:

On the cover page, column 1, line 8, "Navy" should be corrected to read -- Army --

The Figure should be corrected to show numerals 42,43,44, and 45 as shown below:

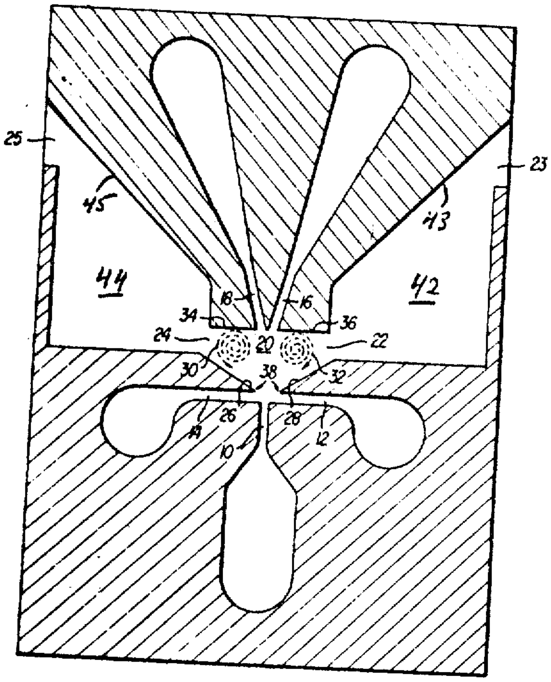

Signed and sealed this 21st day of March 1972.

(SEAL)
Attest:

EDWARD M. FLETCHER, JR.
Attesting Officer

ROBERT GOTTSCHALK
Commissioner of Patents